United States Patent [19]

Yoneda

[11] Patent Number: 5,345,411
[45] Date of Patent: Sep. 6, 1994

[54] CONTENT ADDRESSABLE MEMORY FOR HIGH SPEED RETRIEVAL OPERATION WITHOUT INTERFERENCE BETWEEN MEMORY CELLS

[75] Inventor: Masato Yoneda, Tokyo, Japan

[73] Assignee: Kawasaki Steel Corporation, Hyogo, Japan

[21] Appl. No.: 982,901

[22] Filed: Nov. 30, 1992

[30] Foreign Application Priority Data

Dec. 18, 1991 [JP] Japan .................................. 3-334964

[51] Int. Cl.$^5$ .............................................. G11C 13/00
[52] U.S. Cl. .................................. 365/49; 365/189.07
[58] Field of Search ............. 365/49, 184, 185, 189.07

[56] References Cited

U.S. PATENT DOCUMENTS 5,050,125  9/1991  Momodomi .......................... 365/185
5,130,947  7/1992  Reed .................................... 365/49

FOREIGN PATENT DOCUMENTS

A-0341897 11/1989 European Pat. Off. .
A-0515103 11/1992 European Pat. Off. .
3278398 12/1991 Japan .................................... 365/49

OTHER PUBLICATIONS

Carlstedt et al., "A Content Addressable Memory Cell with MNOS Transistors", IEEE Journal of Solid-State Circuits, vol. 8, No. 5, Oct., 1973, pp. 338-343.

Primary Examiner—Eugene R. LaRoche
Assistant Examiner—F. Niranjan
Attorney, Agent, or Firm—Oliff & Berridge

[57] ABSTRACT

A semiconductor integrated circuit capable of retrieving data from a number of memory cells without mutual interference at high speed and making it possible to build a large capacity data base at higher speed is provided with a set of retrieval memory word blocks including a first and a second memory unit respectively for defining the electrical connection or otherwise nonconnection between a first or second data line and a source electrode line and a control word line for controlling these memory units, a match line having a first potential setting means for setting a first potential beforehand, a sense amplifier for detecting the potential of the match line, and a second potential fixing means for fixing the potential of the match line to a second potential with the source electrode line as a control input. The second potential fixing means is made active or inactive by means of the control word line to control the potential of the match line by making or breaking the connection between the first and second data lines and the common source electrode line in accordance with the definition of the connections of the first and second memory units.

8 Claims, 5 Drawing Sheets

PRIOR ART

CONTENT ADDRESSABLE MEMORY FOR HIGH SPEED RETRIEVAL OPERATION WITHOUT INTERFERENCE BETWEEN MEMORY CELLS

BACKGROUND OF THE INVENTION

The present invention relates to CAM (Content Addressable Memory).

Heretofore, fully parallel CAMs (Content Addressable Memories, which are also called associative memories), have been widely known as semiconductor integrated circuits having the functions of performing the match detection of retrieval data and stored data concurrently in terms of all bits and outputting the match address of stored data (see "Design of CMOS VLSI," pp 176–177, edited by Tetsuya Iizuka and supervised by Takuo Sugano, Baifukan, 1989).

However, the bitwise configuration of a typical conventional CAM comprising SRAM cells and exclusive NOR circuits has made it impossible to provide CAM having a large-sized cell and consequently a capacity at a level fit for practical use.

In many IC cards that have recently been commercialized as personal data bases, for instance, no CAM has been arranged as stated above. In such an IC card, an arrangement has been made to find out data for the intended purpose by sequentially retrieving data one after another from ROM (Read Only Memory) in which the data are prestored. For this reason, the greater the number of data becomes, as in language dictionaries such as Japanese and English-Japanese dictionaries, the more it requires time to retrieve data. In other words, what has high-speed, flexible retrieval functions is still nonexistent.

If all data are made retrievable at a time as in the case of CAM, not by retrieving data one by one with the aid of software from the conventional ROM and the like in the prior art as stated above, data retrieval from the IC card equipped with a large memory capacity may be implemented with flexibility at high speed.

BRIEF SUMMARY OF THE INVENTION

In view of the foregoing problems, it is an object of the present invention to provide a semiconductor integrated circuit capable of retrieving data from a number of memory cells without mutual interference at high speed and making it possible to build a large capacity data base at higher speed.

In order to accomplish the object as stated above, a semiconductor integrated circuit embodying the present invention comprises at least one retrieval memory word block, the block including a first memory unit for defining the electrical connection or otherwise nonconnection between a first data line and a common source electrode line, a second memory unit for defining the electrical nonconnection or otherwise connection between a second data line and the common source electrode line, and a control word line for controlling the first and second memory units, a match line having a first potential setting means for setting a first potential beforehand, a sense amplifier for detecting the potential of the match line, and a second potential fixing means for fixing the potential of the match line to a second potential with the source electrode line as a control input, the second potential fixing means being made active or inactive by means of the control word line to control the potential of the match line by making or breaking the connection between the first and second data lines, and the common source electrode line in accordance with the definition of the connections of the first and second memory units.

Preferably, the first data line, the second data line, the common source electrode line and the match line are commonly used for a plurality of the retrieval memory word blocks.

Preferably, the first memory unit of each retrieval memory word block is connected in parallel between the first data line and the common source electrode line, and the second memory unit of each retrieval memory word block is connected in parallel between the second data line and the common source electrode line.

Preferably, the first memory units of the retrieval memory word blocks are connected in series, the first memory units are connected at one terminal to the first data line by way of a selective transistor and at the other terminal to the common source electrode line, the second memory units of the retrieval memory word blocks are connected in series, and the second memory units are connected at one terminal to the second data line by way of a selective transistor and at the other terminal to the common source electrode line. Now, the first and second memory units are composed of a depression transistor or an enhancement transistor in accordance with the definition of the connection of the first and second memory units.

In this case, the memory unit is preferably formed with a nonvolatile transistor. Here, the nonvolatile transistor is preferably mask ROM, EPROM, EEPROM or UVEPROM.

DETAILED DESCRIPTION OF THE INVENTION

The present invention will be described below in detail.

In the semiconductor integrated circuit according to the present invention, the first and second memory units for defining the connection or nonconnection between the first and second data lines and the common source electrode line are controlled by the control word line in the one set of retrieval memory word blocks. Therefore, the first and second data lines can be connected or disconnected by the control word line to or from the common source electrode line in accordance with the definition of the connections of the first and second memory units.

When the first or second data line is connected to the common source electrode line to make the potential of the latter variable so as to make the common source electrode line a control input, the potential of the match line, which has been set by the first potential setting means to the first potential, is controlled by making active or inactive the second potential fixing means for fixing the potential of the match line to the second potential, and the result is received by the sense amplifier connected to the match line, whereby matching with the first and second memory units is obtainable from the retrieval data applied to the first and second data lines. Even though memory cells whose threshold voltage, for instance, considerably varies are used for the first and second memory units, the block-to-block electrical collision can completely be eliminated among the plurality of retrieval memory word blocks controlled by one and the same control word line even when there exists a retrieval memory word block mismatching the retrieval data and another matching the retrieval data. Therefore, the result of matching is secured with remarkable accuracy and the freedom of memory cell selection can thus be increased to a greater extent.

Referring to the accompanying drawings, a description will subsequently be given of the preferred embodiment of the present invention in the form of a semiconductor integrated circuit.

Prior to giving a detailed description of the present invention, new structure as well as ingenious substances pertaining to the present invention will be clarified by reference to problems arising when a nonvolatile memory cell whose threshold voltage considerably varies is applied to a high integration CAM.

Figure 5:
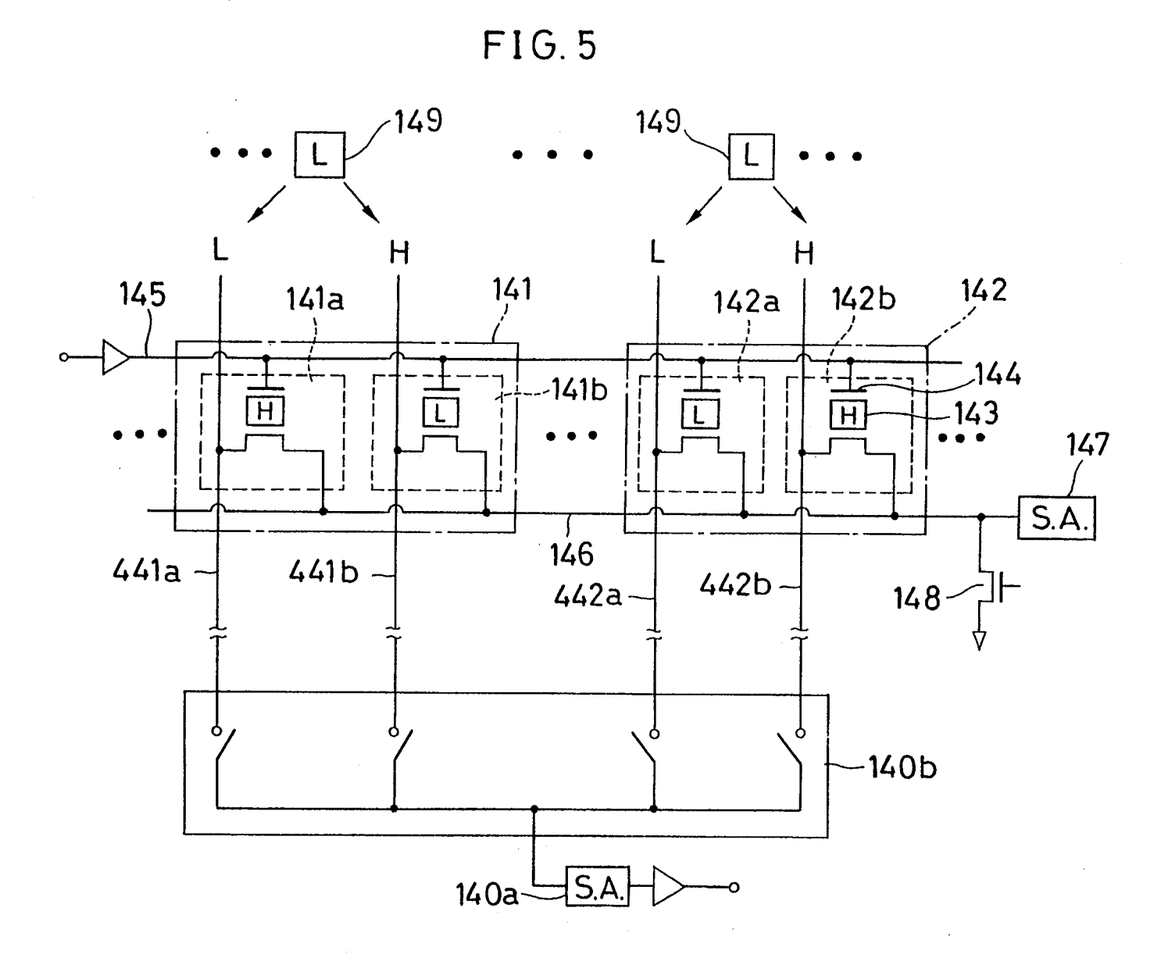
FIG. 5 is a block diagram of a CAM cell using EEPROM.

FIG. 5 illustrates a newly considered CAM flash EEPROM structure with two bits as one set.

As shown in FIG. 5, a pair of memory cells 141a, 141b constituting a memory 141 and a pair of memory cells 142a, 142b constituting a memory 142 are defined as respective CAM cells. In this case, a selection circuit 140b and a sense amplifier 140a provided ahead of data lines 441a, 441b, 442b are used to read data from each memory cell as ROM.

What is shown in this example is called a stacked-gate structure in which control gates 144 are laid right above respective floating gates 143 for storing electric charge and this structure is considered fit for large-scale integration.

Figure 6:
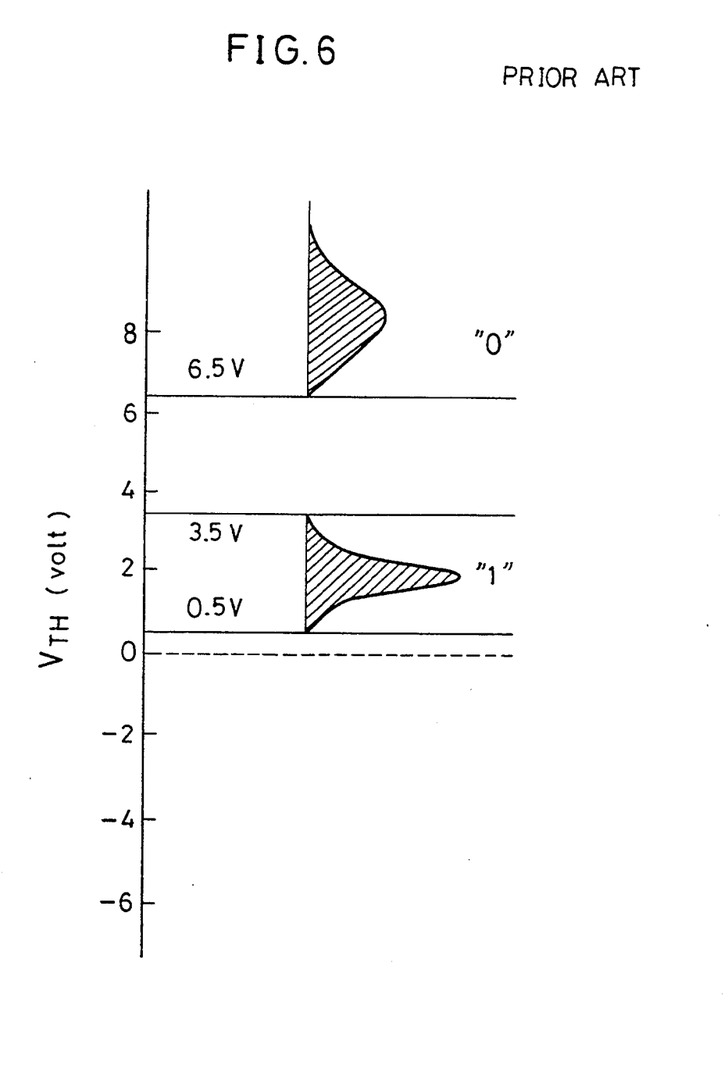
FIG. 6 is a distribution chart illustrating variations of the threshold voltage Vt of the EEPROM memory cell.

FIG. 6 shows the distribution of the threshold voltage Vt varying with the storage of charge in the floating gate 143 in each memory cell.

The low threshold voltage Vt(L) of the memory cell having the stacked-gate structure roughly ranges from 0.5 to 3.5V and has a variation of about 3V. It has been considered extremely difficult, in view of structure or the fabrication process, to suppress the variation further.

In the case of the CAM structure, this variation becomes ruinous. With this fact as one of the arguing points, a further description will be given as follows.

Electrons are injected into the floating gate 143 of the memory cell 141a, whereby the following is defined: a high threshold voltage Vt (H) (defined as data "0" L (low)); a low inverted threshold voltage Vt(L) (defined as data "1" H (high)) in the case of the memory cell 141b; a low inverted threshold voltage Vt(L) in the case of the memory cell 142a; and a high threshold voltage Vt(H) in the case of the memory cell 142b. In other words, the "0" L (low) data is defined in the CAM cell comprising the memory pair 141, whereas the "1" H (high) is defined in the CAM cell comprising the memory pair 142.

In this state, a consideration is given to a case where data "0" L (low) and "0" L (low) of the reference data 149 are detected in the respective CAM cells.

First, a grounded transistor 148 is turned off and a retrieval sense amplifier 147 is set active. The retrieval sense amplifier 147 is an amplifier of a current driving type and has driving capability itself. Therefore, the potential of a match line 146 is set at roughly 1.5–2.0V. The set potential should preferably be small enough not to affect the cumulative charge of the floating gate 143 and not greater than 2V is generally preferred.

The general CAM operation is such that the charge of the match line set at precharged high potential is discharged by the "0" L (low) of the data line of a mismatch CAM cell and the match line is changed to have low potential. The match line thus changed represents mismatch and conversely what maintains the high potential without the potential change represents match.

In this example, the data "1" H (high) of the CAM cell of the memory pair 142 differs from the reference data "0" L (low) and the match line 146 is changed to have low potential by discharging to a data line 442a "0" L (low).

In the specific retrieval operation, the "0" L (low) potential 0V of the reference data is applied to a data line 441a, whereas the "1" H (high) potential 1.5~2.0V is conversely applied to a data line 441b. Similarly, the "0" L (low) potential of 0V of the reference data is applied to the data line 442a, whereas the "1" H (high) potential 1.5~2.0V is conversely applied to a data line 442b. At this time, the high potential is set at as low as roughly 1.5~2.0V for the reason stated above.

When a selective word line 145 becomes active in that state, the memory cells 141a, 142b whose threshold voltage Vt is Vt (H) (>6.5V: see FIG. 6) remains in the OFF state. However, the memory cells 141b, 142a operate differently.

First, the memory cell 142a is specifically considered. In order to cause mismatch to be detected by pulling out the charge of the match line 146, the memory cell 142a has to be turned on. Notwithstanding, the threshold voltage Vt takes 0.5~3.5V in value (see FIG. 6). Moreover, the data line 442a falls on the source electrode side at this time and 0V is applied thereto. Therefore, the voltage Vw of the selective word line 145 needs to be over 3.5V and about 4.5V which is higher by 1V is normally considered suitable.

In other words, the potential of the match line 146 is lowered by pulling out the current into the 0V of the data line 442a for the first time when the voltage of the selective word line 145 is set at Vw≧4.5V. On the other hand, the retrieval sense amplifier 147 is of the current driving type and has driving capability. For this reason, the potential of the match line 146 finally drops to about 1.0~1.5V and mismatch is detected because of this voltage drop of about 0.5V.

Although the voltage drop is used to detect the mismatch, the memory cell 141b of the CAM cell that has stored the match data may malfunction.

The potential of the three electrodes (drain, gate and source) of the memory cell 141b is taken into consideration as follows: over 4.5V of the selective word line 145 at the gate; 1.0~1.5V of the potential of the match line 146 at the source; and 1.5~2.0V of the data line at the drain. That is, the potential difference VGS between the gate and source of this transistor is over 3.0~3.5V (4.5−(1.0~1.5)).

Incidentally, the threshold voltage Vt of the memory cell 141b is minimum 0.5V (see FIG. 6).

In other words, $V_{GS}$ (=3.0~3.5)>Vt (=0.5) is established and the nonvolatile memory cell 141b with the threshold voltage varying greatly from 0.5~3.5V is caused to be turned on even though a rise in the threshold voltage of the memory cell 141b due to the substrate bias effect is taken into consideration at this time. Consequently, the through current flows from the high potential of the data line 441b to the low potential of the data line 442a.

In the case of an associate memory, the retrieval operation is generally performed over a plurality of selective word lines. Therefore, the through current in the selective word lines in the whole chip tends to grow large in value, thus posing a serious problem of non-operation.

Moreover, another problem arises from a rise in the potential of the data match line 146 because of the high potential of the data line 441b, so that the potential difference detection by the retrieval sense amplifier 147 becomes extremely difficult.

Referring to the accompanying drawings, a description will be given of a specific semiconductor integrated circuit based on a study of foregoing problems from a new angle according to the present invention.

Figure 4:
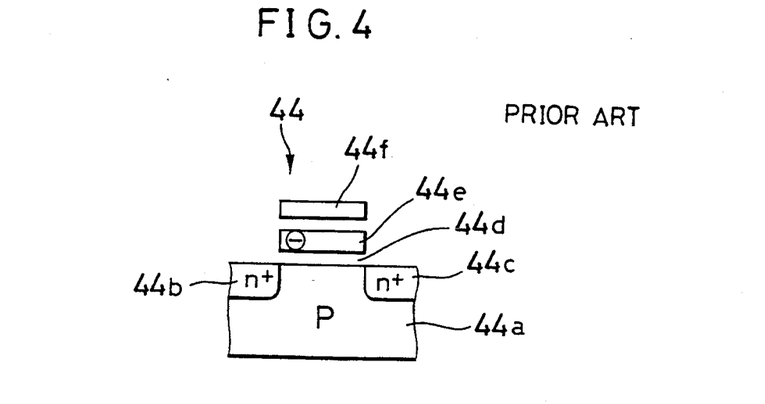
FIG. 4 is a sectional view of an EEPROM memory cell structure for use in the memory cell of the present invention.

Like what is shown previously, a CAM memory of FIG. 1 is constructed of EEPROM memory cells with two bits as one set forming a CAM structure unit. A CAM memory cell 1 comprises, for instance, stack type flash EEPROM cells 1a, 1b in which the control gates 4 are laid right above respective floating gates 3 for storing electric charge and data are written to the EEPROM cells 1a, 1b in such a way that storage states are contrary to each other. In this case, 0 and 1 are to be written to the EEPROM cells 1a, 1b, respectively. As shown in FIG. 4, an EEPROM memory cell 44 comprise, for instance, a source 44b and a drain 44c of an n type formed in a P substrate 44a, a tunnel oxide film 44d therebetween on the P substrate 44a, a floating gate 44e on the oxide film, and a control gate 44f thereon. An erase state (where the stored data is "0") is defined by raising the threshold voltage $V_{TH}$ to 5V or higher by injecting hot electrons into the floating gate 44e at the time of writing. Moreover, "1" is written by pulling electrons out of the floating gate 44e toward the source 44b or the drain 44c. In this case, a threshold voltage Vt(H) of 6.5V or higher is defined as "0" and a low threshold voltage ranging 0.5~3.5V as "1".

Figure 1:
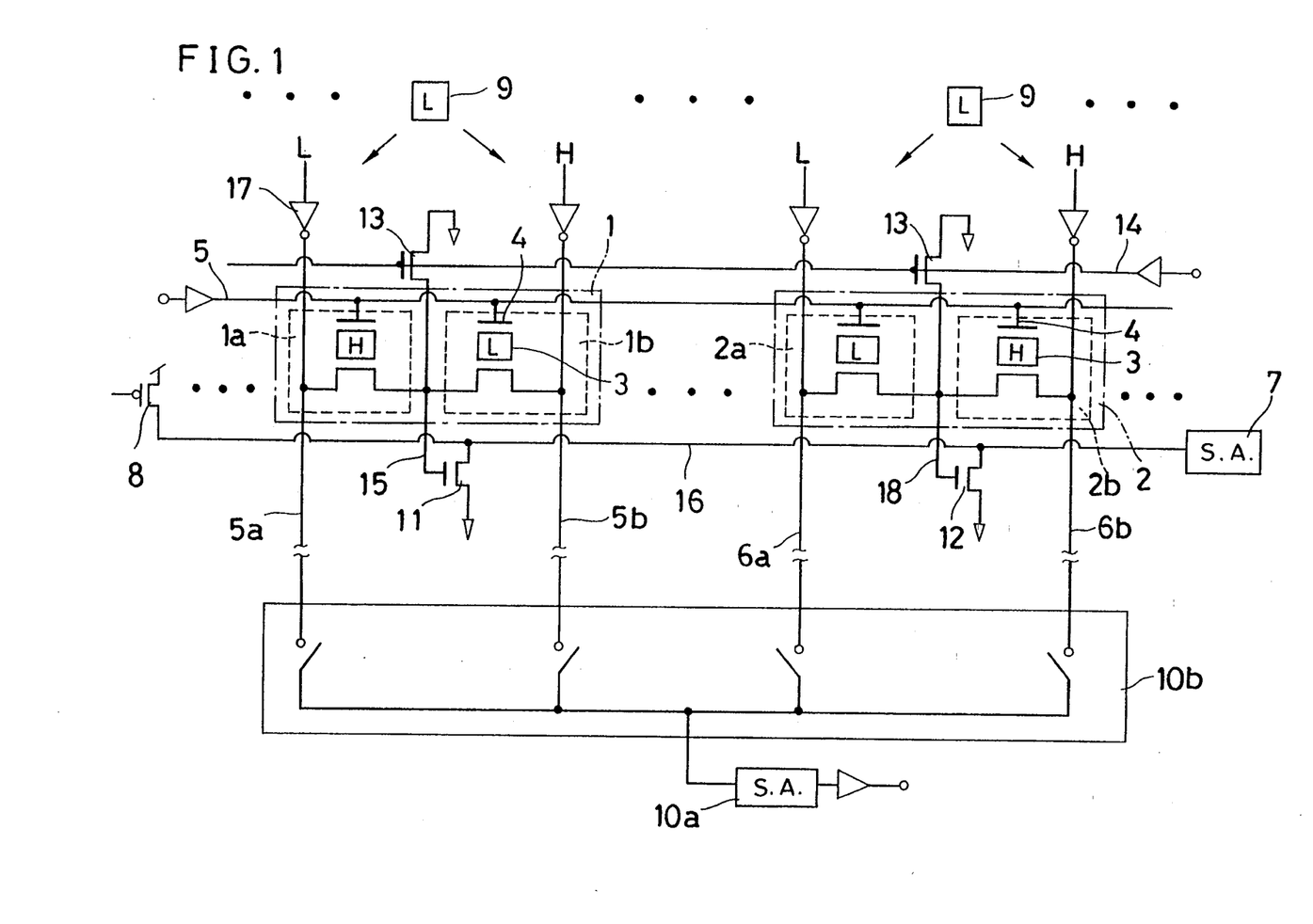
FIG. 1 illustrates a CAM cell structure in a semiconductor integrated circuit embodying the present invention.

In the CAM memory cell 1, the drain of the EEPROM memory cell 1a is connected to a bit line 5a and that of the EEPROM memory cell 1b to a bit bar line 5b and further the sources of both memory cells 1a, 1b to a common source electrode line 15. The CAM memory cell 2 is also arranged similarly excluding the contents of data in the EEPROM memory cells as components. The input of the source electrode line 15 is connected to the control gate of a discharge transistor 11 so that a match line 16 can be fixed to the ground potential. Moreover, there is also provided a transistor 13 for fixing the potential itself of the source electrode line 15 to the ground potential.

In the normal reading operation as ROM, the transistor 13 become active by a control line 14 to which a high potential is applied and the potential of the common source electrode line 15 is fixed to the ground potential, and the high potential is applied to a selective word line. The memory cell to be read the data thereof is selected by a selection circuit 10b provided at the leading ends of the bit lines 5a and 6a, and the bit bar lines 5b and 6b and the data is detected and read out by a sense amplifier 10a provided with the selection circuit 10b.

A plurality of CAM memory cells are disposed with the match line 16 and the selective word line 5 for common use.

A description will subsequently be given below of the fact that retrieval operation of input data is possible in the CAM memory thus structured without causing any inconvenience as stated above.

The threshold voltage Vt of the EEPROM cell 1a on the side of the bit line 5a of the CAM memory cell 1 is "Vt (H) (Vt>6.5V)" and this means data "L(0)" has been written. On the other hand, the threshold voltage Vt of the EEPROM cell 1b on the side of the bit bar line 5b is "Vt (L) (0.5V<Vt (3.5V)" and its data is "H(1)" The CAM cell 1 in this state is defined as "L(0)" and the CAM cell 2 as "H(1)" likewise. It is therefore assumed that a match comparison is made by inputting "L(0)" to the CAM cell 1 and also inputting "L(0)" to the CAM cell 2 as retrieval data 9.

During the retrieval operation, the potential fixing transistor 13 is held OFF and precharged to the high state by a precharge transistor 8 for setting the potential of the match line 16. At this time, the gate inputs of discharge transistors 11, 12 are kept at L (low) and inactive.

A description will subsequently be given of the operation of the discharge transistors 11, 12 after 5V has been applied to the selective word line 5.

First, the CAM cell 1 is considered.

Inverted data H(1) of the input data L(0) is applied by an inversion inverter 17 to the bit line 5a. Conversely, the bit bar line 5b carries L(0).

As stated above, 0V is applied in the case of L(0) and about 1.0~1.5V is applied in the case of H(1).

With respect to the EEPROM memory cell la, the threshold voltage Vt>6.5V and the OFF state is maintained even when 5V is applied to the selective word line 5. With respect to the EEPROM memory cell 1b, moreover, 0.5V<threshold voltage Vt<3.5V and the ON state is established as the source electrode line 15 has been preset at 0V. However, 0V is maintained since the bit bar line 5b is also at 0V potential in the L(0) state. Consequently, the gate potential of a discharge transistor 11 is kept at 0V and this transistor is turned off. In other words, data in the CAM cell and the retrieval data "L" are matching.

Further, the CAM cell 2 is considered.

In this case, 1.0~1.5V in the H(1) state is applied to a bit line 6a and 0V in the L(0) state to a bit bar line 6b likewise.

With respect to the EEPROM memory cell 2b, the threshold voltage Vt>6.5V and the OFF state is maintained.

On the other hand, the EEPROM memory cell 2a stays in a different state.

The voltage of a source electrode line 18 is preset at 0V. The bit line 6a is at 1.0~1.5V and the gate voltage is at 5V. The threshold voltage Vt of this memory cell is 0.5V <Vt<3.5V. Therefore, the ON state is established. As a result, the source electrode line 18 is charged up to a voltage of about 1.0~1.5V.

Notwithstanding, the input of the source electrode line 18 is connected to the gate of the discharge transistor 12 and this transistor is turned on.

When the discharge transistor 12 is turned on, the charge on the precharged match line 16 is pulled out and the voltage is set to 0V, whereby data mismatch is detected by a sense amplifier (S. A.) 7.

As set forth above, a match comparison is made in between the CAM cell driven by the same selective word line 5 and retrieval input data. In other words, the match line is set at L(0) provided mismatch with the retrieval input data occurs in any one of the CAM cells.

When such mismatch occurs, potential collision takes place via the common match line between the bit lines of the match CAM cell and the mismatch CAM cell as shown in the preceding embodiment. However, the common match line is not directly coupled to the bit line (or the bit bar line) of the CAM cell in the structure of this embodiment. It is therefore possible to completely prevent the potential collision between different CAM cells.

Although the CAM cell having EEPROM memory cells with two bits as one set has been shown by way of example, the present invention is not limited to this embodiment but needless to say applicable to ordinary nonvolatile memory cells (mask ROMs, EPROMs and the like).

Figure 2:
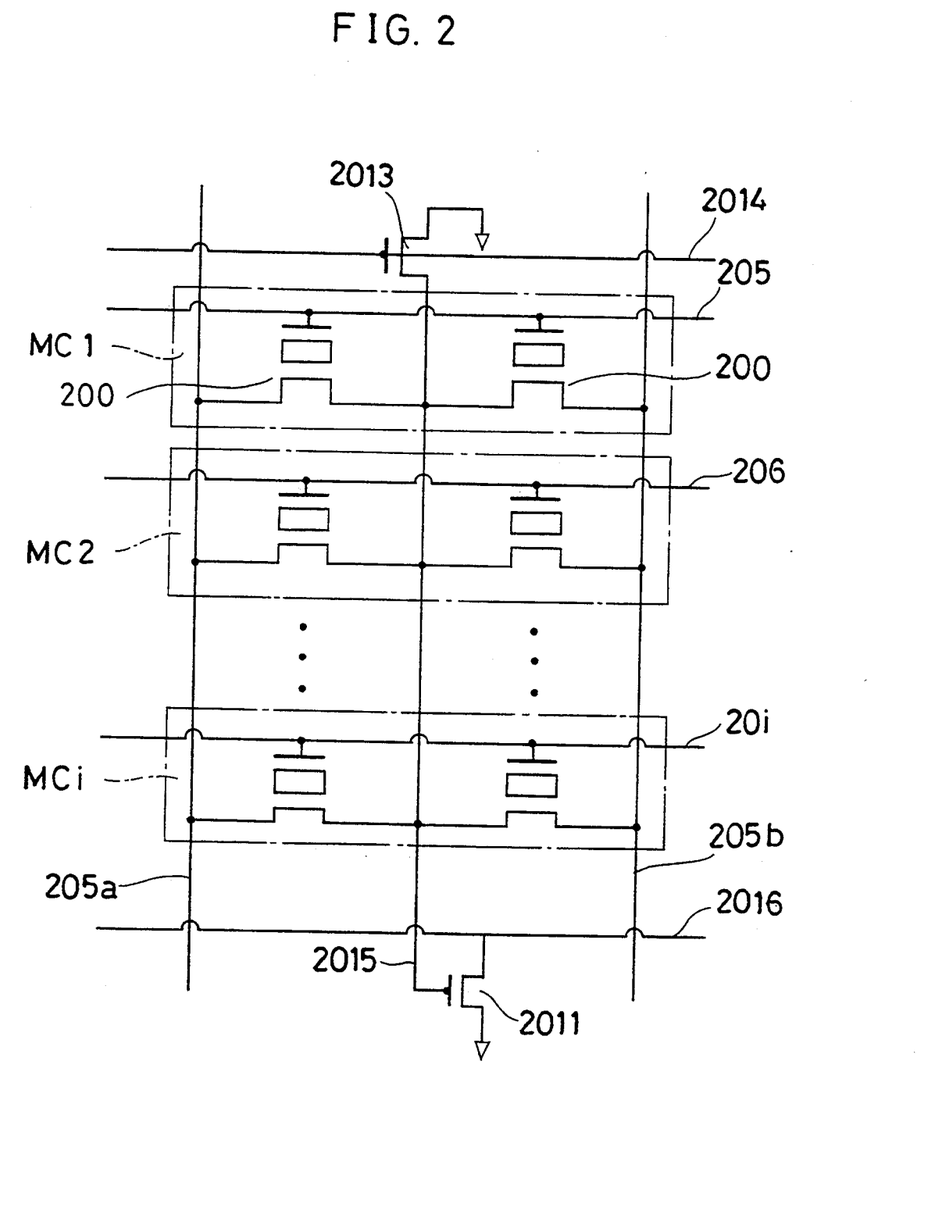
FIG. 2 illustrates part of another CAM cell structure embodying the present invention.

FIG. 2 refers to a structure in which a match line, a sense amplifier (S. A. ), a bit line and a bit bar line for common use are provided for large-scale integration (See U.S. patent application Ser. No. 07/883,595).

For a common source electrode line 2015, a common bit line 205a and a common bit bar line 205b, there are provided i (i≧2) pieces of CAM cells, HC1, HC2, ..., HCi having nonvolatile memory cells 200 with two bits as one set. Each nonvolatile memory cell 200 of one side of the CAM cells HC1, HC2, ..., HCi is connected in parallel between the common bit line 205a and the common source electrode line 2015, and each nonvolatile memory cell 200 of other side of the CAM cells HC1, HC2, ..., HCi is connected in parallel between the common bit bar line 205b and the common source electrode line 2015. Each CAM cell is individually selected by means of selective word lines 205, 206, ..., 20i and the retrieval operation is performed by a match line 2016, a discharge transistor 2011, a sense amplifier (not shown) provided at the leading end of the match line 2016 and the like. In this case, a potential fixing transistor 2013 is used to fix the potential of the common source electrode line 2015 to the ground potential by applying the high potential to a control line 2014.

Figure 3:
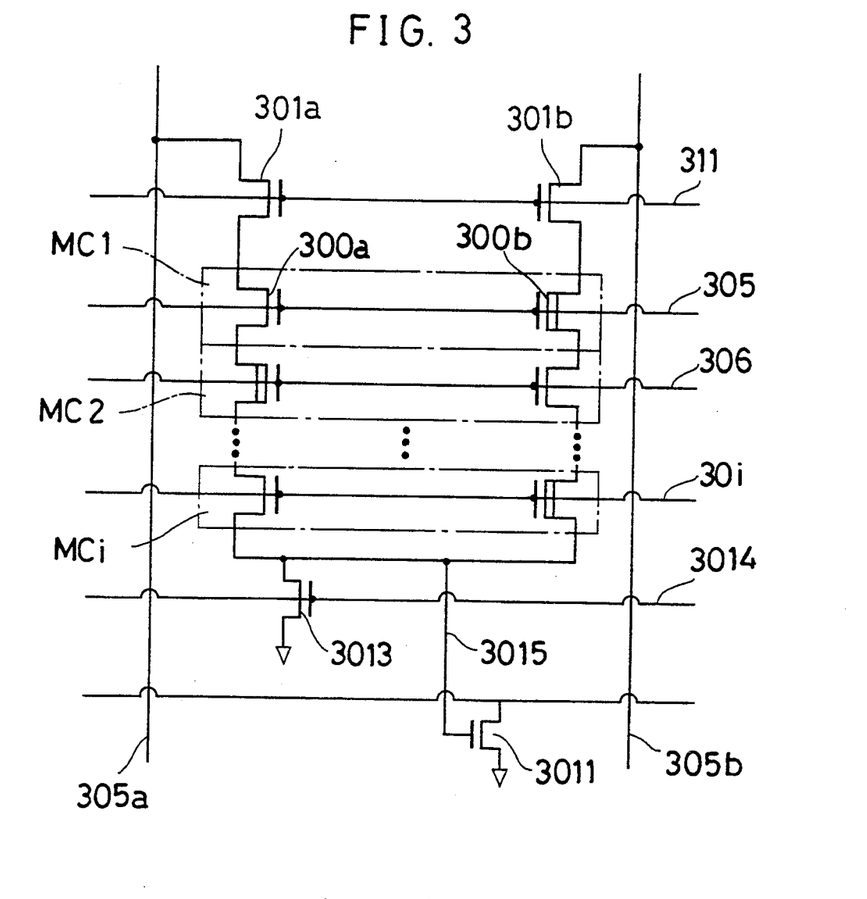
FIG. 3 illustrates part of the CAM cell structure when the present invention is applied to a NAND CAM cell.

Although a description has generally been given of the NOR type memory cells, the structure according to the present invention is usable for NAND type CAM cells and FIG. 3 illustrates a memory block in the CAM cell of this type. A detailed description has already been given of the NAND type structure in U.S. patent application Ser. No. 07/883,595.

This structure, like that of an ordinary NAND type memory, includes a common bit line 305a, a common bit bar line 305b, a memory block selective line 311, and i (i≧2) pieces of CAM cells MC1, MC2, ..., MCi which are connected in series. Each CAM cell in this example comprises an enhancement transistor 300a and a depletion transistor 300b in pair, whose gate electrodes are connected a same selective word line 305. Each CAM cell is individually selected by means of selective word lines 305, 306, ..., 30i. A common source electrode line 3015 is provided with a potential fixing transistor 3013 controlled by a control line 3014 and a discharge transistor 3011 controlled by the common source electrode line 3015. Thus, one side transistor chain of i pieces CAM cells connected in series is connected at one terminal to a selective transistor 301a, and at other terminal to the common source electrode line 3015. Other side transistor chain of i pieces CAM cells connected in series is connected at one terminal to a selective transistor 301b, and at other terminal to the common source electrode line 3015. The selective transistors 301a and 301b are connected to the common bit line 305a and the common bit bar line 305b, respectively. Both gate electrodes of the selective transistors 301a and 301b are connected to the memory block selective line 311. The CAM cell may needless to say be replaced with a nonvolatile EEPROM.

According to the present invention, it is possible to form a NOR or NAND type CAM memory based on nonvolatile memory cells such as ROM (mask ROM) or EPROM, EEPROM or UVEPROM.

Particularly, the electrical collision between CAM cells can be avoided completely at the time of retrieval operation even when the threshold voltage of the memory cell forming each CAM cell greatly varies. The freedom of memory cell selection can thus be increased to a greater extent.

What is claimed is:

1. A semiconductor integrated circuit comprising:
   a plurality of retrieval memory word cells arranged in a matrix array to form a plurality of rows of cells and a plurality of columns of cells;
   a plurality of control word lines, each control word line associated with a corresponding row of cells;
   a plurality of match lines, each match line associated with at least one corresponding row of cells;
   a plurality of first data lines, each match line associated with at least one corresponding row of cells;
   a plurality of first data lines, each first data line associated with a corresponding column of cells;
   a plurality of second data lines, each second data line associated with the corresponding column of cells;
   a plurality of sense amplifiers for detecting an electrical potential of a match line, each sense amplifier connected to a corresponding match line;
   a plurality of first potential setting means for setting a potential of the match line to a first potential, each first potential setting means connected to the corresponding match line;
   a plurality of common source electrode lines, each common source electrode line associated with the corresponding column of cells, which is in the at least one corresponding row of cells;
   a plurality of first potential fixing means for adjusting the potential of the match line to a second potential, each first potential fixing means connected to the corresponding match line with a corresponding common source electrode line as a control input; and
   a plurality of second potential fixing means for adjusting the potential of a common electrode line to a third potential, each second potential fixing means connected to the corresponding common source electrode line;
   wherein each retrieval memory word cell comprises:
   a first memory unit providing a first circuit path between the corresponding common source electrode line and the corresponding first data line; and a second memory unit providing a second circuit path between the corresponding common source electrode line and the corresponding second data line; and wherein the corresponding control word line controls the first and second memory units of each cell of the corresponding row during a data retrieval operation to establish one of the first and the second circuit paths between the corresponding common source electrode line and one of the corresponding first and second data lines, and to controlling each of the corresponding first potential fixing means to regulate the potential of the corresponding match line.

2. A semiconductor integrated circuit according to claim 1, wherein said each common source electrode line and said each match line are associated with a corresponding plurality of rows of cells.

3. A semiconductor integrated circuit according to claim 2, wherein said first memory units of the retrieval memory word cells are connected in series, said first memory units are connected at one terminal to said first data line by way of a selective transistor and at the other terminal to said common source electrode line, said second memory units of the retrieval memory word cells are connected in series, and said second memory units are connected at one terminal to said second data line by way of a selective transistor and at the other terminal to said common source electrode line.

4. A semiconductor integrated circuit according to claim 3, wherein said first and second memory units are composed of a depletion transistor in accordance with the definition of the connection of said first and second memory units.

5. A semiconductor integrated circuit according to claim 3, wherein said first and second memory units are composed of an enhancement transistor in accordance with the definition of the connection of said first and second memory units.

6. A semiconductor integrated circuit according to claim 2, wherein said first memory unit of each retrieval memory word cell is connected in parallel between said first data line and said common source electrode line, and said second memory unit of each retrieval memory word cell is connected in parallel between said second data line and said common source electrode line.

7. A semiconductor integrated circuit according to claim 1, wherein said memory unit is composed of a nonvolatile memory cell.

8. A semiconductor integrated circuit according to claim 7, wherein said nonvolatile memory cell is one of mask ROM, EPROM, EEPROM and UVEPROM.

* * * * *

UNITED STATES PATENT AND TRADEMARK OFFICE
CERTIFICATE OF CORRECTION

PATENT NO. : 5,345,411
DATED : September 6, 1994
INVENTOR(S) : Masato YONEDA

It is certified that error appears in the above-indentified patent and that said Letters Patent is hereby corrected as shown below:

Claim 1, line 9, (col. 8, line 37), delete "a plurality of first data lines, each match line associ-"; and line 10, (col. 8, line 38), delete "ated with at least one corresponding row of cells;".

Signed and Sealed this

Eighteenth Day of July, 1995

*Attest:*

BRUCE LEHMAN

*Attesting Officer*  *Commissioner of Patents and Trademarks*